(12) United States Patent
Hwang et al.

(10) Patent No.: US 8,749,423 B2
(45) Date of Patent: Jun. 10, 2014

(54) AMPLIFYING CIRCUIT AND ANALOG DIGITAL CONVERSION CIRCUIT WITH THE SAME

(75) Inventors: Won Seok Hwang, Icheon-si (KR); Seung Hoon Lee, Seoul (KR); Jung Eun Song, Seoul (KR); Dong Hyun Hwang, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 96 days.

(21) Appl. No.: 13/479,592

(22) Filed: May 24, 2012

(65) Prior Publication Data

US 2012/0299758 A1 Nov. 29, 2012

(30) Foreign Application Priority Data

May 25, 2011 (KR) ........................ 10-2011-0049807

(51) Int. Cl.
*H03M 1/14* (2006.01)
*H03F 3/45* (2006.01)

(52) U.S. Cl.
CPC *H03M 1/145* (2013.01); *H03F 3/45* (2013.01)
USPC ............................. 341/161; 341/163; 330/254

(58) Field of Classification Search
USPC ................... 341/161, 162, 163; 330/254, 261
See application file for complete search history.

(56) References Cited

U.S. PATENT DOCUMENTS

| | | | | |
|---|---|---|---|---|
| 6,684,065 B2 * | 1/2004 | Bult et al. | ................... | 455/252.1 |
| 6,870,495 B1 * | 3/2005 | Zadeh et al. | ................... | 341/161 |
| 7,304,598 B1 | 12/2007 | Bogner | | |
| 7,688,143 B2 * | 3/2010 | Kimura | ......................... | 330/254 |
| 7,855,671 B2 * | 12/2010 | Dura et al. | .................... | 341/155 |
| 7,924,204 B2 * | 4/2011 | Chang et al. | .................. | 341/161 |
| 8,258,869 B2 * | 9/2012 | Zhao et al. | .................... | 330/254 |

(Continued)

FOREIGN PATENT DOCUMENTS

| | | | |
|---|---|---|---|
| JP | 2008271280 A | 6/2008 | |
| KR | 1020020057251 A | 7/2002 | |
| KR | 1020060099303 A | 9/2006 | |
| KR | 1020080024676 A | 3/2008 | |

OTHER PUBLICATIONS

Wen et al., A 12b 60MS/s SHA-Less Opamp-Sharing Pipeline A/D with Switch-Embedded Dual Input OTAs, 2012 IEEE International Symposium on Circuits and Systems (ISCAS), May 2012, pp. 802-805, INSPEC Accession Number: 12946908.*

(Continued)

*Primary Examiner* — Howard Williams
(74) *Attorney, Agent, or Firm* — William Park & Associates Patent Ltd.

(57) ABSTRACT

An analog to digital converting device includes a first digital conversion (ADC) circuit configured to convert an inputted analog signal into a first digital signal, a first multiplying digital to analog converting (MDAC) circuit configured to amplify a difference between a first converted signal and the inputted analog signal, a second ADC circuit configured to convert an output of the first MDAC circuit into a second digital signal, a second MDAC circuit configured to amplify difference between a second converted signal converted from the second digital signal and the output of the first MDAC circuit, a third ADC circuit configured to convert an output of the second MDAC circuit into a third digital signal, and a common amplifying circuit shared by the first and the second MDAC circuits, wherein the common amplifying circuit consumes current based on which MDAC circuit the common amplifying circuit operates with.

24 Claims, 4 Drawing Sheets

(56) References Cited

U.S. PATENT DOCUMENTS

| | | | |
|---|---|---|---|
| 2007/0159374 A1 | 7/2007 | Chen | |
| 2007/0290915 A1* | 12/2007 | Morimoto | 341/161 |
| 2008/0042890 A1* | 2/2008 | Cho | 341/161 |

OTHER PUBLICATIONS

Kim, Moo-Young et al., 10-bit 100-MS/s Pipelined ADC Using Input-Swapped Opamp Sharing and Self-Calibrated V/I Converter, IEEE Transactions on Very Large Scale Integration (VLSI) Systems, vol. 19, No. 8, Aug. 2011, pp. 1438-1447.*

Chandrashekar, Kailash et al., A 10 b 50 MS/s Opamp-Sharing Pipeline A/D With Current-Reuse OTAs, IEEE Transactions on Very Large Scale Integration (VLSI) Systems, vol. 19, No. 9, September 2011, pp. 1610-1616.*

* cited by examiner

AMPLIFYING CIRCUIT AND ANALOG DIGITAL CONVERSION CIRCUIT WITH THE SAME

CROSS-REFERENCE(S) TO RELATED APPLICATIONS

The present application claims priority 35 U.S.C. 119(a) to Korean Patent Application No. 10-2011-0049807, filed on May 25, 2011, in the Korean Intellectual Property Office, which is incorporated herein by reference in its entirety.

BACKGROUND OF THE INVENTION

1. Field of the Invention

The present invention relates to an integrated circuit, and more particularly to an analog to digital conversion circuit configured to convert an analog value into a digital value.

2. Description of the Related Art

A digital integrated circuit receives a digital signal and performs an operation to output a digital signal, some integrated circuits, however, may receive an analog signal. For processing an analog signal, an integrated circuit generally includes an analog to digital conversion circuit (ADC) configured to convert an analog signal into a digital signal. For example, a signal inputted to a sensor included in a device for processing an image is an analog signal. The signal should be converted into a digital signal for internal information processing. Because information received by the sensor of an image processing device is typically a minuscule signal, the image processing device should include an ADC with high resolution to recognize the minuscule signal.

A high performance ADC with a high resolution and a sampling speed of tens of millions Hz has been required in not only image processing systems such as a digital camera, a digital camcorder and a digital TV, but also communication systems such as a wireless communication device, an asynchronous digital subscriber loop (ADSL) device and an IMT-2000 device.

For an ADC, several-types of structures have been suggested. For example, there is a flash structure, a folding structure, a sub-ranging structure, a pipeline structure, and the like. Recently, among those structures, the pipeline structure has been widely used because it can satisfy high-speed signal processing conditions and high resolution conditions, and also optimize operation speed, power consumption and scalability. The ADC with a pipeline structure includes plural stage pipelines. Herein, each stage can be a single-bit structure deciding a 1-bit data or a multi-bit structure deciding two or more bits data.

A plurality of unit circuits included in an ADC having a pipeline structure each converts a partial portion of an analog signal into a predetermined-bit digital signal and delivers a remaining portion of the analog signal to the next unit circuit. The ADC requires an amplifying circuit configured to amplify the remaining portion of an analog signal before the remaining portion is delivered. However, the amplifying circuit consumes a lot of power, so this is a handicap of the ADC with a high resolution.

SUMMARY OF THE INVENTION

An embodiment of the present invention is directed to an amplifying circuit, which can optimize power consumption; and an analog to digital converting device with a pipeline structure including the amplifying circuit.

In accordance with an embodiment of the present invention, an analog to digital converting device includes a first digital conversion (ADC) circuit configured to receive an analog signal and convert a part of the analog signal into a first digital signal having a first predetermined number of bits; a first multiplying digital to analog converting (MDAC) circuit configured to amplify a difference between a first converted signal converted as an analog value from the first digital signal and the analog signal; a second ADC circuit configured to convert a signal amplified by the first MDAC circuit into a second digital signal having a second predetermined number of bits; a second MDAC circuit configured to amplify a difference between a second converted signal converted as an analog value from the second digital signal and the signal outputted from the first MDAC circuit; a third ADC circuit configured to convert a signal amplified by the second MDAC circuit into a third digital signal having a third predetermined number bits; and a common amplifying circuit shared by the first MDAC circuit and the second MDAC circuit, wherein the common amplifying circuit consumes a different amount of current according to which MDAC circuit the common amplifying circuit operates with.

In accordance with another embodiment of the present invention, an amplifying device includes a first load part including a first current path configured to provide a first current amount and a second current path configured to provide a second current amount; a first input part configured to receive a first analog signal and to amplify the first analog signal by controlling a current amount delivered from the first load part; a second input part configured to receive a second analog signal and to amplify the second analog signal by controlling a current amount delivered from the first load part; and a constant current part configured to output an constant current delivered from one of the first input part and the second input part into one of a third current path, a fourth current path, and both the third and the fourth current paths.

DESCRIPTION OF SPECIFIC EMBODIMENTS

Example embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough, and will convey a scope of the present invention to those skilled in the art. Throughout the disclosure, like reference numerals refer to like parts throughout the various figures and embodiments of the present invention.

Figure 1:
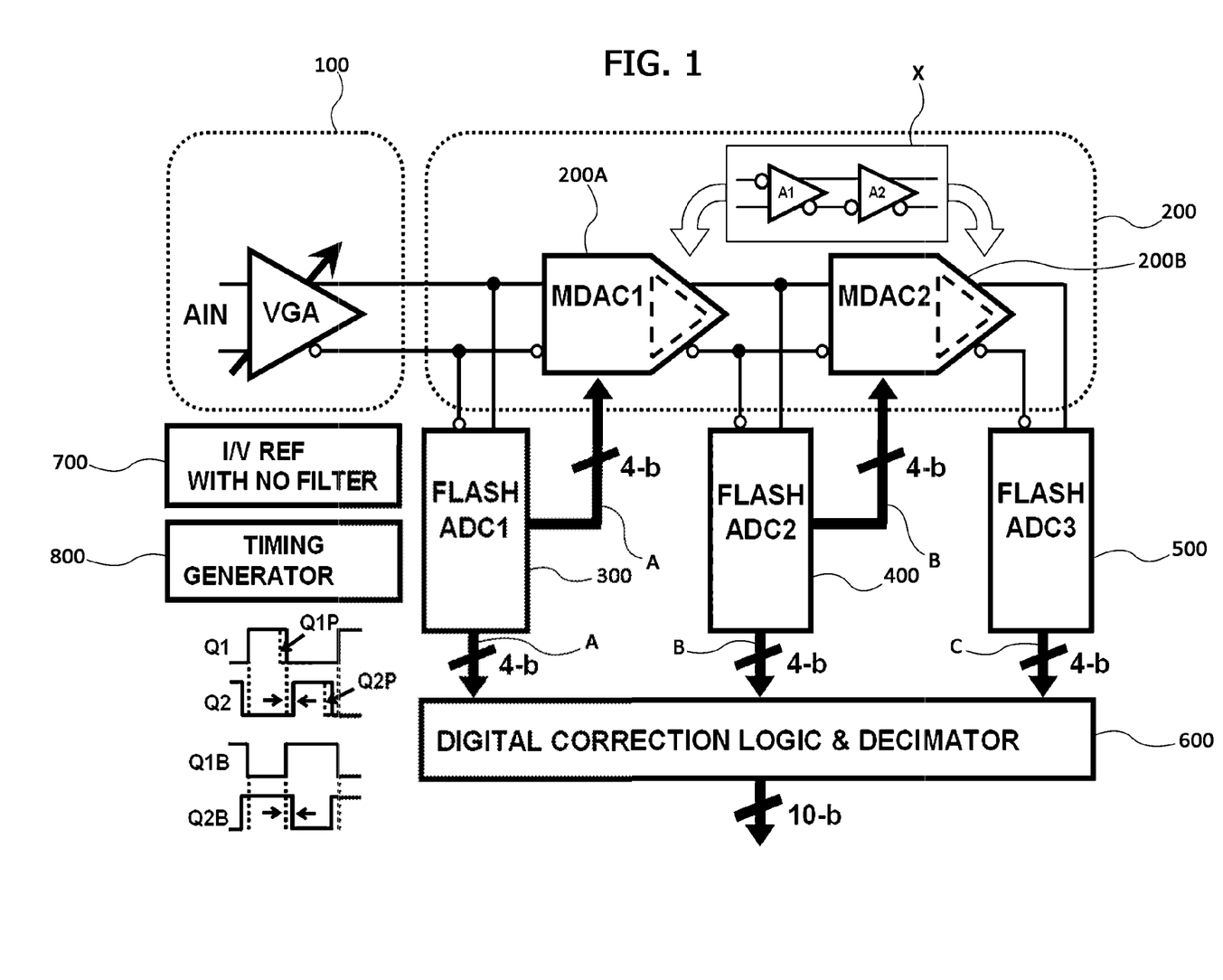
FIG. 1 is a block diagram showing an analog to digital converting device with a pipeline structure in accordance with an embodiment of the present invention.

FIG. 1 is a block diagram showing an analog to digital converting device with a pipeline structure in accordance with an embodiment of the present invention.

As shown, the analog to digital converting (ADC) device includes an input block 100, a multiplying digital to analog converting (MDAC) block 200, first to third flash ADC circuits 300, 400 and 500, a digital value correction block 600, a reference signal providing block 700, and a timing generating block 800.

The input block 100 receives an analog signal AIN provided from external parts and delivers the analog signal AIN to the MDAC block 200 and the first flash ADC block 300. The MDAC block 200 includes first and second MDAC circuits 200A and 200B. The first to the third flash ADC blocks 300, 400 and 500 respectively convert an inputted analog value into a digital value having a predetermined number of bits (for example, 4 bits) and provides the digital value to the digital value correction block 600. Generally, the ADC device with a pipeline structure includes a plurality of MDAC circuits and a plurality flash ADC blocks, each corresponding to each MDAC circuit such that for each MDAC circuit there is a corresponding flash ADC block. However, in the first embodiment, there are two MDAC circuits and three flash ADC blocks corresponding to the two MDAC circuits. Thus, in this embodiment, there is not a one-to-one correspondence of MDAC circuits to flash ADC blocks.

The first flash ADC block 300 converts an analog signal provided from the input block 100 into a 4-bit digital value A and delivers the 4-bit digital value A to the digital value correction block 600 and to the first MDAC circuit 200A. The first MDAC circuit 200A converts the 4-bit digital value A, provided from the first flash ADC block 300, into an analog value and amplifies a difference between the analog value and the analog signal inputted from the input block 100. The second flash ADC block 400 converts an analog signal outputted from the first MDAC circuit 200A into a 4-bit digital value B and outputs the 4-bit digital value B to the digital value correction block 600 and to the second MDAC circuit 200B.

The second MDAC circuit 200B converts the 4-bit digital value B provided from the second flash ADC block 400 into an analog value and amplifies a difference between the analog value and the analog signal outputted from the first MDAC circuit 200A. The third flash ADC block 500 converts an analog signal outputted from the second MDAC circuit 200B into a 4-bit digital value C and outputs the 4-bit digital value C to the digital value correction block 600.

The digital value correction block 600 combines the 4-bit digital values A, B and C outputted from the first to the third flash ADC blocks 300, 400 and 500 to output a 10-bit digital value. Herein, while a 10-bit digital value is the final output from the digital value correction block 600, each of the first to the third flash ADC blocks 300, 400 and 500 respectively outputs a 4-bit digital value. The digital value correction block 600 outputs a 10 bit value rather than the 12 bits that the block 600 receives from the flash ADC blocks 300, 400, and 500, because for error correction there is a one-bit overlap value between the first and the second flash ADC blocks 300 and 400, and one-bit overlap value between the second and the third flash ADC blocks 400 and 500.

The reference signal providing block 700 serves to provide a reference signal used for operations of the first to third flash ADC blocks 300, 400 and 500, and the first and the second MDAC circuits 200A and 200B. Accordingly, the reference signal providing block 700 may be coupled with the first to the third flash ADC blocks 300, 400 and 500, and the first and the second MDAC circuits 200A and 200B so as to provide the reference signal to the first to the third flash ADC blocks 300, 400 and 500, and the first and the second MDAC circuits 200A and 200B. The timing generating block 800 serves to provide switching signals Q1, Q1B, Q2 and Q2B to the first to the third flash ADC blocks 300, 400 and 500 and the first and the second MDAC circuits 200A and 200B. Accordingly, the timing generating block 800 may be coupled with the first to the third flash ADC blocks 300, 400 and 500 and the first and the second MDAC circuits 200A and 200B to provide the switching signals Q1, Q1B, Q2 and Q2B to the first to third flash ADC blocks 300, 400 and 500 and the first and the second MDAC circuits 200A and 200B. The switching signals Q1 and Q2 have no overlapped activation period, but inversed switching signals Q1B and Q2B have a partially overlapped activation period.

The first and the second MDAC circuits 200A and 200B included in the ADC device with a pipeline structure may have an amplifying circuit to amplify a signal or a value. However, because a single-stage amplifying circuit is generally not sufficient to meet a required DC voltage gain, a two-stage amplifying circuit may be used. Also, in the ADC device, the first and the second MDAC circuits 200A and 200B do not operate simultaneously but successively. Thus, to implement an effective system in an embodiment of the present invention, a two-stage amplifying circuit X may be commonly shared by the first and the second MDAC circuits 200A and 200B. The two-stage amplifying circuit X can include a switched current Op-amplifier.

Figure 2:
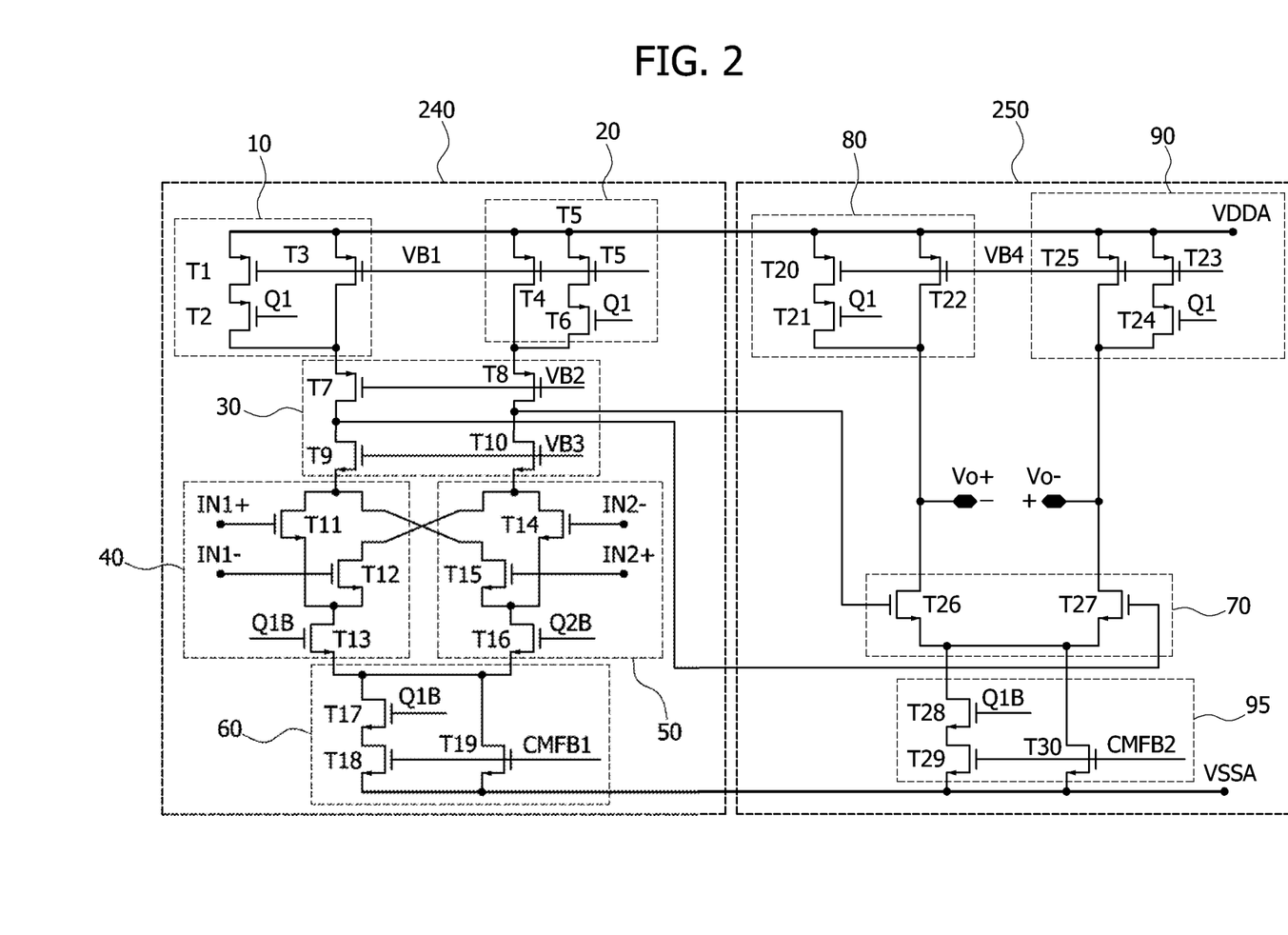
FIG. 2 includes block diagrams depicting a first amplifying circuit and a second amplifying circuit shown in FIG. 1.

FIG. 2 includes block diagrams depicting a first amplifying circuit/unit and a second amplifying circuit/unit shown in FIG. 1.

As shown, the first amplifying circuit 240 includes first and second load parts 10 and 20, an output part 30, first and second input parts 40 and 50, and a first constant current part 60. The first load part 10 includes transistors T1 and T2, connected to each other in series, for supplying 15% of a predetermined current through a first current path; and a transistor T3 for supplying 85% of the predetermined current through a second current path. The second load part 20 includes transistors T5 and T6, connected to each other in series, for supplying 15% of a predetermined current through a third current path; and a transistor T4 for supplying 85% of a predetermined current through a fourth current path. The first and the second load parts 10 and 20 respectively, each have two current paths. The ratio of 85% and 15% current amount delivered through the two current paths can be adjusted according to embodiments of the present invention. The output part 30 includes four transistors T7 to T10. The four transistors T7 to T10 may be divided into two pairs, and each pair of transistors may be connected to each other in series. The output part 30 is formed in a telescopic structure which may be used in an amplifier.

The first input part 40 includes a transistor T11 having a gate to receive a positive input signal IN1+, a transistor T12 having a gate to receive a negative input signal IN1−, and a transistor T13 having a gate to receive a switching signal Q1B, where transistor T13 may operate as a switching unit and may be connected in series to at least one of the transistors T11 and T12. The transistor T13 may have one of a source/drain commonly coupled to the transistors T11 and T12. The second input part 50 includes three transistors T14, T15 and T16 corresponding to the three transistors T11, T12 and T13 included in the first input part 40. Similarly, transistor T16 may operate as a switching unit, and may be connected to at least one of the transistors T14 and T15 in series.

The first constant current part 60 includes two current paths, two transistors T17 and T18 connected to each other in series and configured to flow 15% of a predetermined current may comprise a current path, and a transistor T19 configured to flow 85% of the predetermined current may comprise a current path. The transistor T17 is turned on by the switching signal Q1B.

The second amplifying unit 250 includes third and fourth load parts 80 and 90, a third input part 70, and a constant current part 95. The third input part 70 includes two transistors T26 and T27, each having a gate to receive a signal provided from the output part 30 of the first amplifying unit 240. The third load part 80 and the fourth load part 90, correspond to the first load part 10 and the second load part 20, respectively. The third load part 80 includes three transistors T20 to T22, and the fourth load part 90 includes three transistors T23 to T25. The second constant current part 95, like the first constant current part 60, includes three transistors, where the three transistors of the second constant current part 95 are transistors T28 to T30.

In the first and the second constant current parts 60 and 95, control signals CMFB1 and CMFB2, are supplied to gates of transistors T18, T19, T29 and T30 for controlling a common mode feedback operation, which serves to maintain a common mode of an output signal from the amplifying unit as a constant value. Herein, because the common mode feedback operation is generally performed in an integrated circuit, description about a circuit configured to generate the control signals CMFB1 and CMFB2 is omitted.

The transistor T30 serves to supply 85% of a predetermined current in the second amplifying unit 250, and the transistors T28 and T29 serves to supply 15% of the predetermined current. The above-mentioned transistors T1 to T30 can be embodied as various types of MOS transistors. For example, some transistors T1 to T8 and T20 to T25 may be embodied as PMOS transistors and other transistors may be embodied as NMOS transistors. Also, control signals VB1 to VB4, which may respectively turn on corresponding transistors, are signals for maintaining a bias voltage for stable operation.

Figure 3:
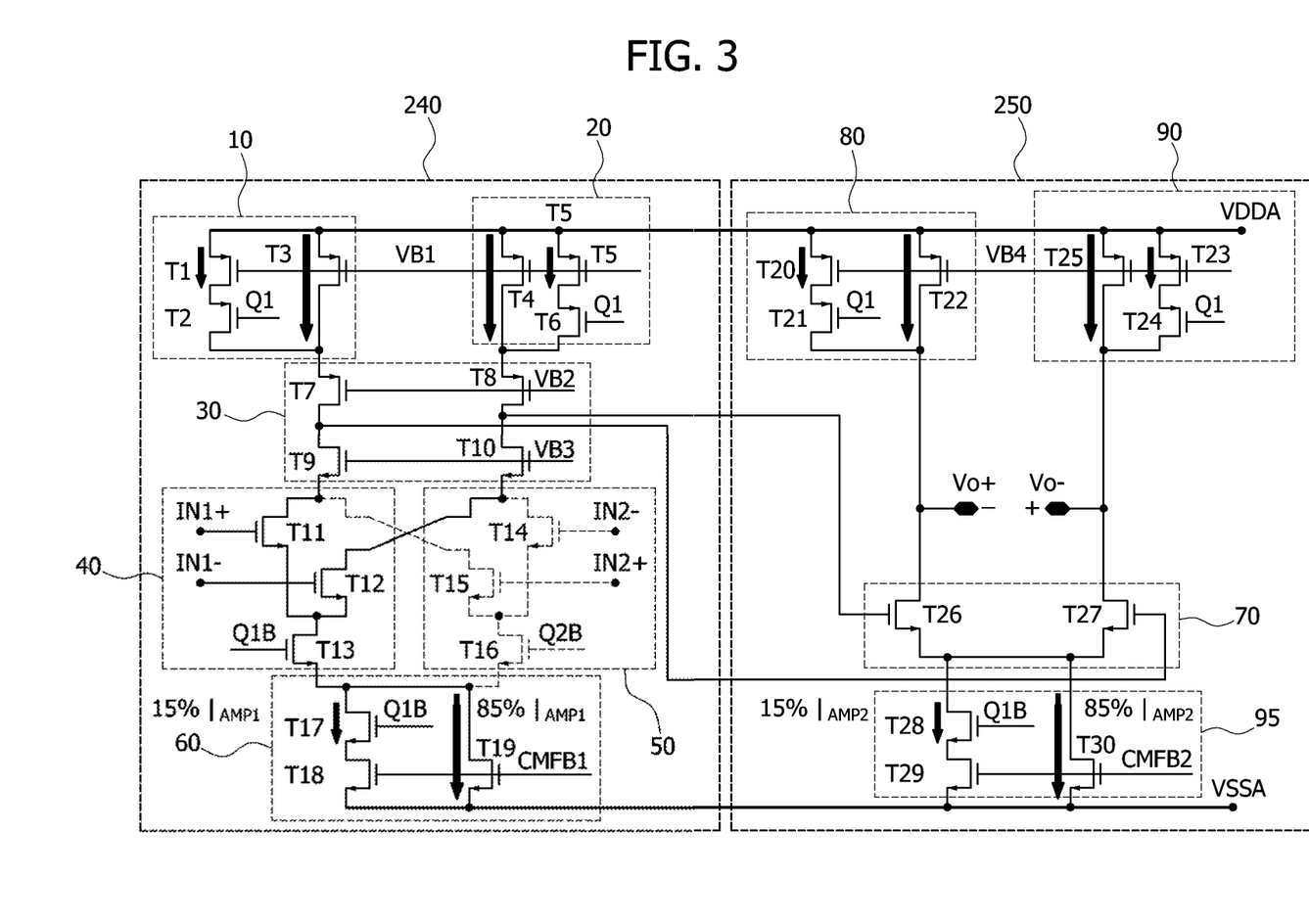
FIGS. 3 and 4 are circuit diagrams describing operations of the first amplifying circuit and the second amplifying circuit shown in FIG. 2.
Figure 4:
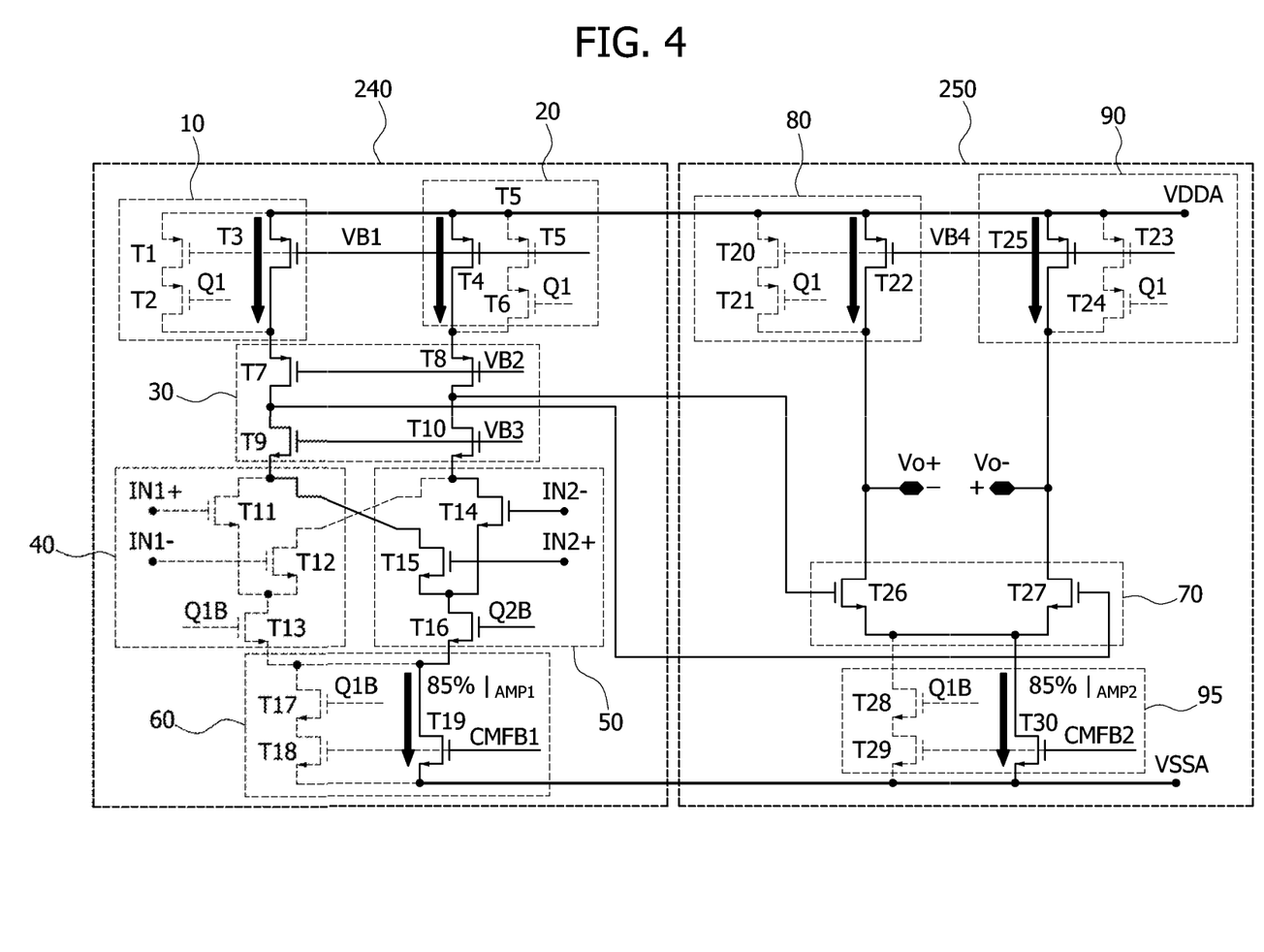

FIGS. 3 and 4 are circuit diagrams that may be used in describing operations of the first amplifying circuit and the second amplifying circuit shown in FIG. 2. As FIG. 3 shows, the first and the second amplifying circuits 240 and 250 apply to operations of the first MDAC circuit 200A, and FIG. 4 shows that the first and the second amplifying circuits 240 and 250 also apply to operations of the second MDAC circuit 200B.

Referring to FIG. 3, when the first and the second amplifying circuits 240 and 250 are used for the first MDAC circuit 200A, the input signals IN1+ and IN1− are inputted to the first input part 40. The second input part 50 does not operate. The switching signal Q1 for turning on the transistors T2, T6, T21 and T24 and the switching signal Q1B for turning on the transistors T13, T17 and T28 are inputted. Thus, except for three transistors included in the second input part 50, all transistors included in the first and the second amplifying circuits 240 and 250 operate to receive the input signals IN1+ and IN1− to output an amplified signal VO+ and VO−.

A partial portion of lines, gates and signals marked by a dotted line shown in FIG. 3 does not operate when the switching signals Q1 and Q1B are received. The first input part 40 receives the input signal. The transistors T1 to T6 included in the first and the second load parts 10 and 20 and the transistors T17 to T19 included in the first constant current part 60 operate. Thus, the first input part 40 may be configured to amplify a difference between an analog signal and a converted analog signal by controlling a current amount delivered from load parts 10 and/or 20, where the analog signal may be the analog signal received from the input block 100, and where the converted analog signal may be an analog signal converted from the 4-bit digital value A. A signal amplified by the first amplifying circuit 240 is inputted to the third input part 70 of the second amplifying circuit 250. In this case, the transistors included in the third and the fourth load parts 80 and 90 and the second constant current part 95 operate to receive the input signals IN1 at gates associated with the transistors T26 and T27, and generate amplified signal VO+ and VO−.

FIG. 4 shows how the first and the second amplifying circuits 240 and 250 operate for the second MDAC circuit 200B. In this case, only 85% of the operation current of the first and the second amplifying circuits 240 and 250 is used. A partial portion comprising lines, gates and signals marked by the dotted line shown in FIG. 4 does not operate. That is, the transistors T3 and T4 included in the first and the second load parts 10 and 20 and the transistor T19 in the first constant current part 60 operate. In addition, input signals IN2− and IN2+ are inputted through the second input part 50. An output signal of the first amplifying circuit 240 is amplified by the second amplifying circuit 250. In this case, the transistors T22 and T25 of the third and the fourth load parts 80 and 90 and the transistor T30 of the second constant current part 95 operate. In the first and the second amplifying circuits 240 and 250, the switching signals Q1 and Q1B selectively determine operations of transistors included in the first to fourth load parts 10, 20, 80 and 90 and the first and the second constant current parts 60 and 95. The transistors T17 and T28 and the transistors T2, T6, T21 and T24 are turned on or off according to the switching signals Q1 and Q1B. Thus, the second input part 50 is configured to receive a difference between a second converted signal and a signal outputted from the first MDAC circuit 200A and amplify the difference by controlling a current amount delivered from the load parts 80 and/or 90, where the second converted signal may be the 4 bit digital signal A that has been converted into an analog signal, and the analog signal outputted from the first MDAC circuit 200A.

The embodiments of the present invention are based on amplifying operations successively performed for a half period of a whole operation period by each MDAC circuit of two nearby pipeline stage included in an ADC device with a pipeline structure. If the first and the second amplifying circuits 240 and 250 are commonly shared by nearby MDAC circuits, power consumption and scalability can be improved. In an embodiment of the present invention, when the first and the second amplifying circuits 240 and 250 are used for the first MDAC circuit 200A, 100% of a predetermined operation current is used for amplifying operations. However, when the first and the second amplifying circuits 240 and 250 are used for the second MDAC circuit 200B, amplifying operation consumes 85% of the predetermined operation current.

In the ADC device with a pipeline structure, a DC voltage gain and a bandwidth required for operation of a predetermined stage MDAC circuit are higher and wider than those of a following-stage MDAC circuit. Typically, capability of amplifying circuits used for all-stage MDAC circuits can meet a requirement of the first-stage MDAC circuit. However, in an embodiment sharing amplifying circuits, because the amplifying circuits are commonly shared and the operation current is controlled, a power which is consumed more than necessary in following-stage MDAC circuit can be reduced for amplifying operations.

In the present invention, the ADC device should be designed to consume a power which is optimized according to required performances of different MDAC circuits, i.e., which stage MDAC circuits (e.g., a first stage or a last stage) an amplifying unit is used for. For the first stage MDAC circuit, 100% amount of operation current may be consumed, but for the last stage MDAC circuit, minimized amount of operation current may be consumed. Controlling current amount flowing through the amplifying unit according to shared stage MDAC circuit, the ADC device can increase efficiency of power consumption.

In the embodiment, when the first and the second amplifying circuits 240 and 250 operate for a first stage, i.e., the first MDAC circuit 200A, 100% of a predetermined operation current is used. When the first and the second amplifying circuits 240 and 250 operate for a second stage, i.e., the second MDAC circuit 200B, the amplifying operation consumes 85% of the predetermined operation current (referring to $I_{AMP1}$ and $I_{AMP2}$). Further, an amplifying device according to an embodiment of the present invention can selectively consume 15% of operation current. For controlling operation current, plural switching units (e.g., T2, T6, T17, T21, T24 and T28 show in FIG. 2) are used. Accordingly, when the second MDAC circuit 200B operates, power consumption of the first and the second amplifying circuits 240 and 250 can be down to 85% of predetermined operation current.

While the present invention has been described with respect to the specific embodiments, it will be apparent to those skilled in the art that various changes and modifications may be made without departing from the spirit and scope of the invention as defined in the following claims.

What is claimed is:

1. An analog to digital converting device, comprising:
   a first digital conversion (ADC) circuit configured to receive an analog signal and convert a part of the analog signal into a first digital signal having a first predetermined number of bits;
   a first multiplying digital to analog converting (MDAC) circuit configured to amplify a difference between a first converted signal converted as an analog value from the first digital signal and the analog signal;
   a second ADC circuit configured to convert a signal amplified by the first MDAC circuit into a second digital signal having a second predetermined number of bits;
   a second MDAC circuit configured to amplify a difference between a second converted signal converted as an analog value from the second digital signal and the signal outputted from the first MDAC circuit;
   a third ADC circuit configured to convert a signal amplified by the second MDAC circuit into a third digital signal having a third predetermined number of bits; and
   a common amplifying circuit shared by the first MDAC circuit and the second MDAC circuit, wherein the common amplifying circuit consumes a different amount of current according to which MDAC circuit the common amplifying circuit operates with.

2. The analog to digital converting device as recited in claim 1, wherein the common amplifying circuit includes:
   a first amplifying unit configured to amplify an inputted signal; and
   a second amplifying unit configured to amplify an output of the first amplifying unit.

3. The analog to digital converting device as recited in claim 2, wherein the first amplifying unit includes:
   a load part including a first current path configured to provide a first current amount and a second current path configured to provide a second current amount;
   a first input part configured to receive a difference between the first converted signal and the analog signal and to amplify the difference by controlling a current amount delivered from the load part;
   a second input part configured to receive a difference between the second converted signal and the signal outputted from the first MDAC circuit and to amplify the difference by controlling a current amount delivered from the load part; and
   a constant current part configured to output a constant current delivered from one of the first input part and the second input part into one of a third current path, a fourth current path, and both the third and the fourth current paths.

4. The analog to digital converting device as recited in claim 3, wherein the first input part includes:
   a first transistor configured to receive at a gate the difference between the first converted signal and the analog signal; and
   a first switching unit connected to the first transistor in series and turned on in response to a first switching signal, and
   wherein the second input part includes:
   a second transistor, connected to the first transistor in parallel, configured to receive at a gate the difference between the second converted signal and the signal outputted from the first MDAC circuit; and
   a second switching unit, connected to the second transistor in series, turned on in response to a second switching signal having an opposite phase of the first switching signal.

5. The analog to digital converting device as recited in claim 4, wherein the first switching signal and the second switching signal, even though having the opposite phase, have different activation periods which are partially overlapped by a predetermined period.

6. The analog to digital converting device as recited in claim 3, wherein the load part includes:
   a first transistor configured to deliver current flowed through the first current path; and
   a second and a third transistor, connected to each other in series and to the first transistor in parallel, configured to deliver current flowed through the second current path when selectively turned on by a switching signal.

7. The analog to digital converting device as recited in claim 6, wherein the constant current part includes:
   a fourth transistor configured to deliver current to the third current path; and
   a fifth and a sixth transistors, connected to each other in series and to the fourth transistor in parallel, configured to deliver current to the fourth current path when selectively turned on by an inverted signal of the switching signal.

8. The analog to digital converting device as recited in claim 6, wherein the constant current provided through the first current path is substantially similar to a constant current outputted to the third current path, and the constant current provided through the second current path is substantially similar to a constant current outputted to the fourth current path.

9. The analog to digital converting device as recited in claim 6, wherein 85% and 15% amounts of predetermined operation current are respectively delivered through the first current path and the second current path.

10. The analog to digital converting device as recited in claim 6, wherein 85% and 15% amounts of predetermined operation current are respectively outputted through the third current path and the fourth current path.

11. The analog to digital converting device as recited in claim 2, wherein the second amplifying unit includes:
   a load part including a first current path configured to provide a first current amount and a second current path configured to provide a second current amount;
   an input part configured to receive the output of the first amplifying unit and amplify the output by controlling a current amount delivered from the load part; and a constant current part configured to output an constant current delivered from the input part into one of a third current path and a fourth current path.

12. The analog to digital converting device as recited in claim 11, wherein the load part includes:
   a first transistor configured to deliver current flowed through the first current path; and
   a second and a third transistors, connected to each other in series and to the first transistor in parallel, configured to deliver current flowed through the second current path when selectively turned on by a switching signal.

13. The analog to digital converting device as recited in claim 12, wherein the constant current part includes:
   a fourth transistor configured to deliver current to the third current path; and
   a fifth and a sixth transistors, connected to each other in series and to the fourth transistor in parallel, configured to deliver current to the fourth current path when selectively turned on by an inverted signal of the switching signal.

14. The analog to digital converting device as recited in claim 1, wherein the common amplifying circuit includes:
   a load part including a first current path configured to provide a first current amount and a second current path configured to provide a second current amount;
   a first input part configured to receive a difference between the first converted signal and the analog signal and to amplify the difference by controlling a current amount delivered from the load part;
   a second input part configured to receive a difference between the second converted signal and the signal outputted from the first MDAC circuit and to amplify the difference by controlling a current amount delivered from the load part; and
   a constant current part configured to output an constant current delivered from one of the first input part and the second input part into one of a third current path, a fourth current path, and both the third and the fourth current paths.

15. The analog to digital converting device as recited in claim 14, wherein the first input part includes:
   a first transistor configured to receive at a gate the difference between the first converted signal and the analog signal; and
   a first switching unit connected to the first transistor in series and turned on in response to a first switching signal, and
   wherein the second input part includes:
   a second transistor, connected to the first transistor in parallel, configured to receive at a gate the difference between the second converted signal and the signal outputted from the first MDAC circuit; and
   a second switching unit, connected to the second transistor in series, turned on in response to a second switching signal having an opposite phase of the first switching signal.

16. The analog to digital converting device as recited in claim 14, wherein the first switching signal and the second switching signal, even though having the opposite phase, have different activation periods which are partially overlapped by a predetermined period.

17. The analog to digital converting device as recited in claim 14, wherein the load part includes:
   a first transistor configured to deliver current flowed through the first current path; and
   a second and a third transistors, connected to each other in series and to the first transistor in parallel, configured to deliver current flowed through the second current path when selectively turned on by a switching signal.

18. The analog to digital converting device as recited in claim 17, wherein the constant current part includes:
   a fourth transistor configured to deliver current to the third current path; and
   a fifth and a sixth transistors, connected to each other in series and to the fourth transistor in parallel, configured to deliver current to the fourth current path when selectively turned on by an inverted signal of the switching signal.

19. The analog to digital converting device as recited in claim 18, wherein the constant current provided through the first current path is substantially similar to a constant current outputted to the third current path, and the constant current provided through the second current path is substantially similar to a constant current outputted to the fourth current path.

20. The analog to digital converting device as recited in claim 19, wherein 85% and 15% amounts of predetermined operation current are respectively delivered through the first current path and the second current path.

21. The analog to digital converting device as recited in claim 19, wherein 85% and 15% amounts of predetermined operation current are respectively outputted through the third current path and the fourth current path.

22. The analog to digital converting device as recited in claim 1, wherein the first to the third predetermined bits are the same number of bits.

23. An amplifying device, comprising:
   a first load part including a first current path configured to provide a first current amount and a second current path configured to provide a second current amount;
   a first input part configured to receive a first analog signal and to amplify the first analog signal by controlling a current amount delivered from the first load part;
   a second input part configured to receive a second analog signal and to amplify the second analog signal by controlling a current amount delivered from the first load part; and
   a constant current part configured to output an constant current delivered from one of the first input part and the second input part into one of a third current path, a fourth current path, and both the third and the fourth current paths.

24. The amplifying device as recited in claim 23, further comprising:
   a second load part including a fifth current path configured to provide a fifth current amount and a sixth current path configured to provide a sixth current amount;
   a third input part configured to receive a signal delivered from one of the first input part and the second input part and to amplify the signal by controlling a current amount delivered from the second load part; and
   a constant current part configured to output an constant current, delivered from the third input part, into one of a seventh current path, a eighth current path, and both the seventh and the eighth current paths.

* * * * *

UNITED STATES PATENT AND TRADEMARK OFFICE
CERTIFICATE OF CORRECTION

PATENT NO. : 8,749,423 B2  
APPLICATION NO. : 13/479592  
DATED : June 10, 2014  
INVENTOR(S) : Won Seok Hwang et al.

Page 1 of 1

It is certified that error appears in the above-identified patent and that said Letters Patent is hereby corrected as shown below:

ON THE TITLE PAGE  
Item (73) Assignee  
Change "SK Hynix Inc., Gyeonggi-do (KR)" to --SK Hynix Inc., Gyeonggi-do (KR) and Industry-University Cooperation Foundation Sogang University, Seoul (KR)--.

Signed and Sealed this  
Fifteenth Day of March, 2016

Michelle K. Lee  
*Director of the United States Patent and Trademark Office*